US009991309B1

(12) United States Patent
Yang et al.

(10) Patent No.: US 9,991,309 B1
(45) Date of Patent: Jun. 5, 2018

(54) CMOS IMAGE SENSOR HAVING ENHANCED NEAR INFRARED QUANTUM EFFICIENCY

(71) Applicant: OmniVision Technologies, Inc., Santa Clara, CA (US)

(72) Inventors: Cunyu Yang, Milpitas, CA (US); Cheng Zhao, San Jose, CA (US); Gang Chen, San Jose, CA (US); Dyson Tai, San Jose, CA (US); Chen-Wei Lu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days. days.

(21) Appl. No.: 15/642,177

(22) Filed: Jul. 5, 2017

(51) Int. Cl.
H04N 5/33 (2006.01)
H04N 5/335 (2011.01)
H04N 5/3745 (2011.01)
H01L 27/146 (2006.01)

(52) U.S. Cl.
CPC .... H01L 27/14649 (2013.01); H01L 27/1461 (2013.01); H01L 27/1463 (2013.01); H01L 27/1464 (2013.01); H04N 5/332 (2013.01); H04N 5/335 (2013.01); H04N 5/3745 (2013.01)

(58) Field of Classification Search
CPC .......... H04N 5/33; H04N 5/332; H04N 5/335; H04N 5/3745; H01L 27/1461; H01L 27/1464; H01L 27/14649
See application file for complete search history.

(56) References Cited

U.S. PATENT DOCUMENTS

| 9,880,057 | B2* | 1/2018 | Cazaux | G01J 5/0862 |
|---|---|---|---|---|
| 2012/0313204 | A1* | 12/2012 | Haddad | H01L 27/1462 257/432 |
| 2015/0287766 | A1* | 10/2015 | Kim | H01L 27/307 250/208.1 |
| 2015/0340391 | A1* | 11/2015 | Webster | H01L 27/14605 348/322 |
| 2016/0005784 | A1* | 1/2016 | Kiyota | H01L 27/14609 348/308 |
| 2017/0208277 | A1* | 7/2017 | Borthakur | H04N 5/378 |
| 2017/0345851 | A1* | 11/2017 | Yang | H01L 27/1461 |

* cited by examiner

Primary Examiner — Daniel M Pasiewicz

(57) ABSTRACT

An image sensor comprises a semiconductor material having an illuminated surface and a non-illuminated surface; a photodiode formed in the semiconductor material extending from the illuminated surface to receive an incident light through the illuminated surface, wherein the received incident light generates charges in the photodiode; a transfer gate electrically coupled to the photodiode to transfer the generated charges from the photodiode in response to a transfer signal; a floating diffusion electrically coupled to the transfer gate to receive the transferred charges from the photodiode; a near infrared (NIR) quantum efficiency (QE) enhancement structure comprising at least two NIR QE enhancement elements within a region of the photodiode, wherein the NIR QE enhancement structure is configured to modify the incident light at the illuminated surface of the semiconductor material by at least one of diffraction, deflection and reflection, to redistribute the incident light within the photodiode to improve an optical sensitivity, including near-infrared light sensitivity, of the image sensor.

20 Claims, 9 Drawing Sheets

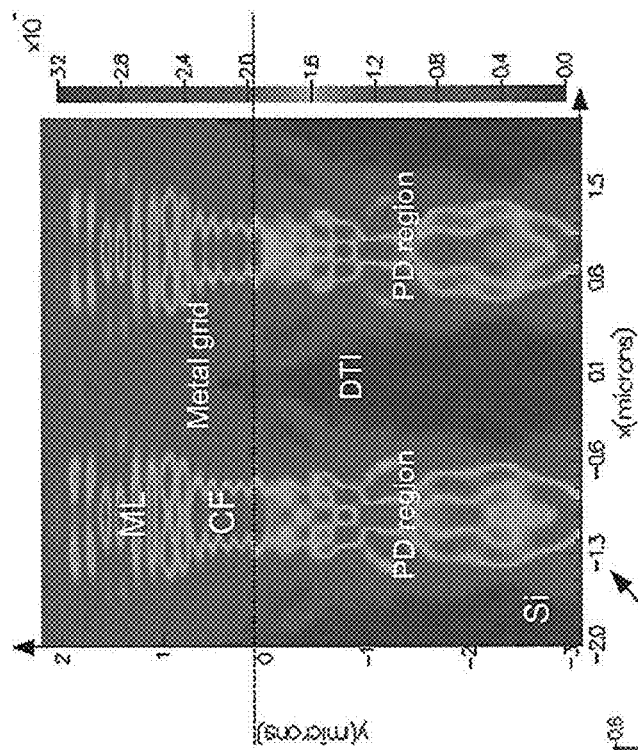
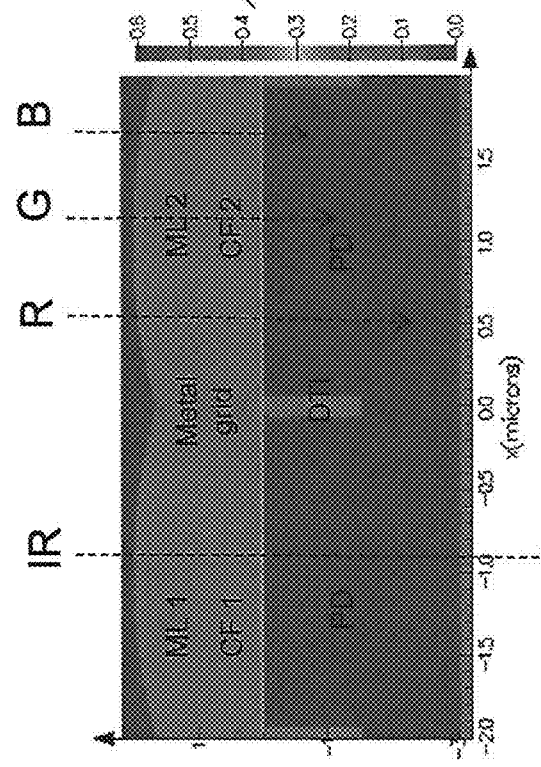
FIG. 9B
FIG. 9A

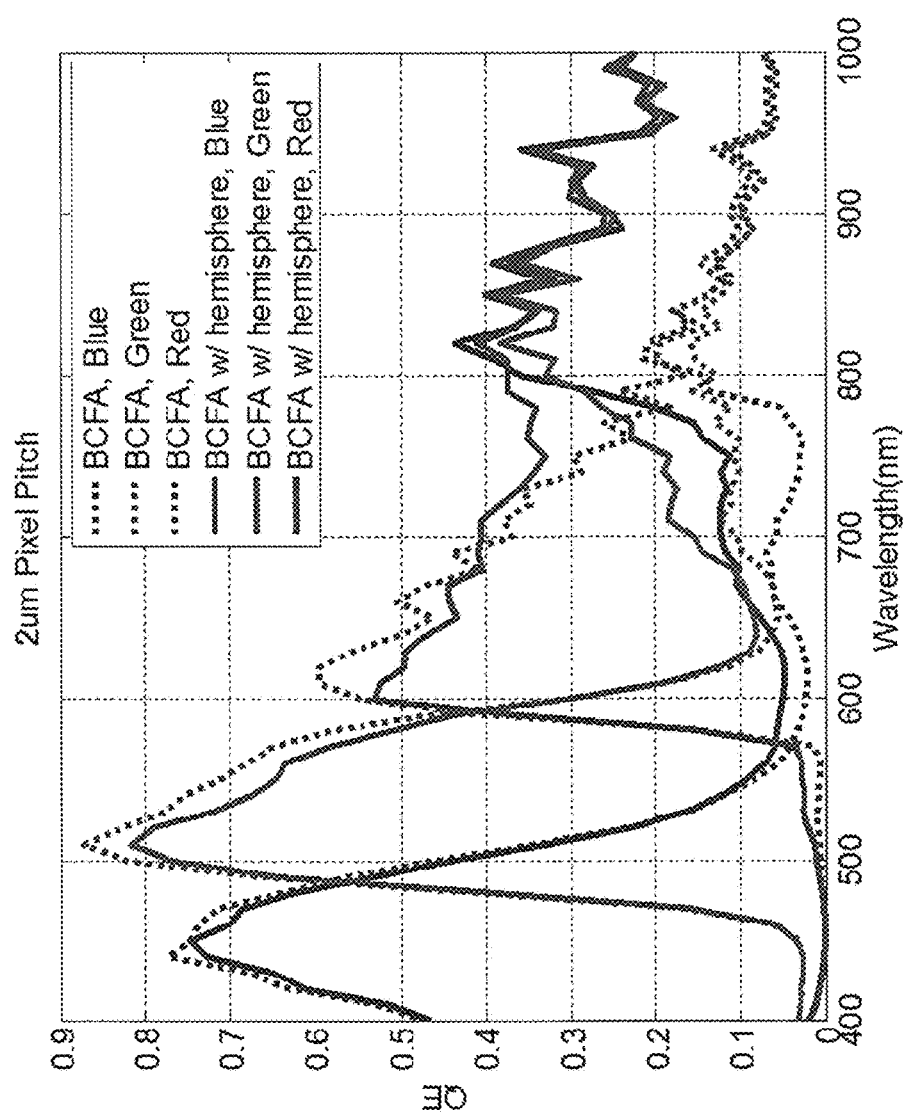
FIG. 11: Simulation Result for IR QE Comparison

CMOS IMAGE SENSOR HAVING ENHANCED NEAR INFRARED QUANTUM EFFICIENCY

TECHNICAL FIELD

This disclosure relates generally to semiconductor image sensors, and in particular but not exclusively, relates to CMOS image sensors having enhanced near infrared (NIR) Quantum Efficiency (QE).

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Detection of near infrared (NIR) light is useful in automotive and night vision applications. However, conventional image sensor devices may poorly absorb NIR light due to the band structure of semiconductor materials used in modern microelectronic devices. Even if conventional image sensors can absorb NIR light, the semiconductor may need to be sufficiently thick. Additional semiconductor thickness may complicate other fabrication steps and/or reduce performance.

Furthermore, many materials conductive to absorb NIR light are very expensive (either inherently or by virtue of fabrication techniques needed to process the materials), toxic, and/or have lower sensitivity to the visible spectrum. Accordingly, many elements/compounds capable of detecting NIR light may not be ideal choices for integration into modern electronic devices.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIG. 9A demonstrates light path through an example backside illuminated image sensor without NIR QE enhancement structures, FIG. 9B demonstrates the simulated light density distribution in the backside illuminated image sensor of FIG. 9A, in accordance with an embodiment of the invention.

FIG. 11 is the simulated QE vs. wavelength of incident light for an example backside illuminated image sensor between the one with and the one without a plurality of NIR QE enhancement structures, in accordance with an embodiment of the invention.

Figure 2A:
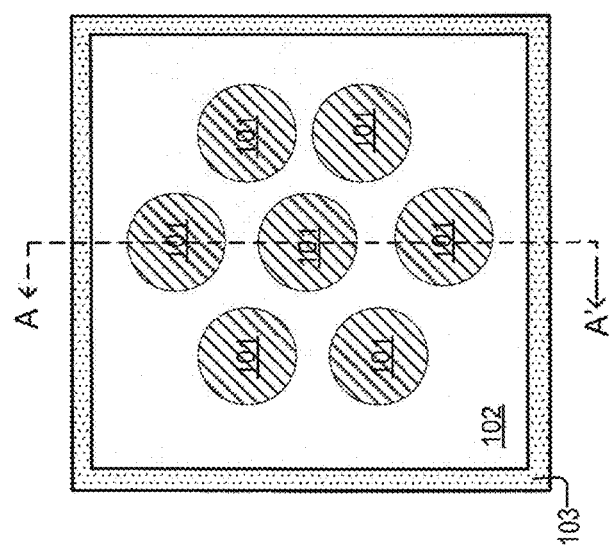
FIG. 2A is a top-down view and FIG. 2B is a cross-sectional view of FIG. 2A as cut along line B-B' for an example photodiode in an image sensor, in accordance with an embodiment of the invention.
Figure 2B:
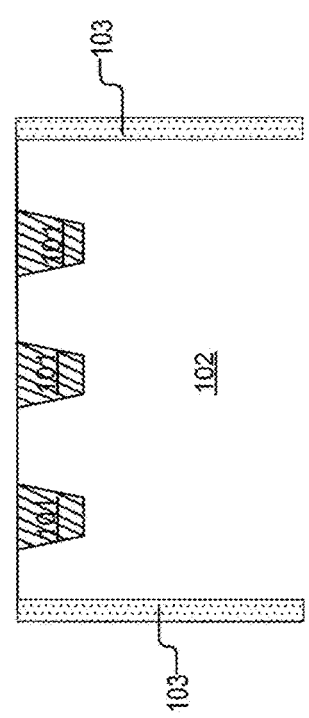

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus for an image sensor with enhanced NIR QE are described herein. In the following description, numerous specific details are set forth to provide a thorough understanding of the examples. However, one skilled in the relevant art will recognize that the techniques described herein can be practiced without one or more of the specific details, or with other methods, components, materials, etc. In other instances, well-known structures, materials, or operations are not shown or described in details in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 12:
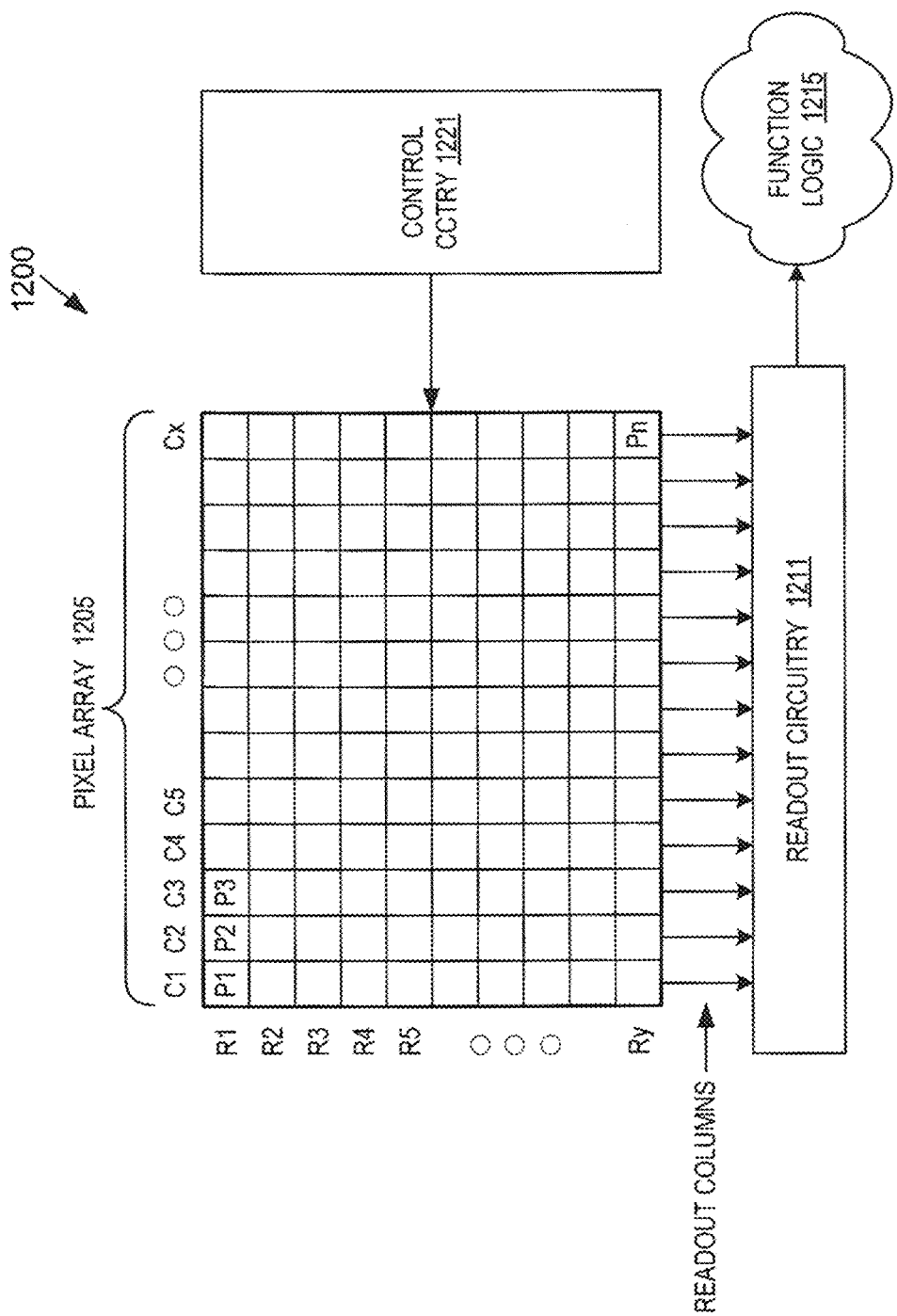
FIG. 12 is a block diagram schematically illustrating one example of an imaging system, in accordance with an embodiment of the disclosure.

FIG. 12 is a block diagram schematically illustrating one example of an imaging system, in accordance with an embodiment of the disclosure. Imaging system 1200 includes pixel array 1205, control circuitry 1221, readout circuitry 1211, and function logic 1215. In one example, pixel array 1205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, in other examples, it is appreciated that the photodiodes do not have to be arranged into rows and columns and may take other configurations.

In one example, after the image sensor photodiode/pixel in pixel array 1205 has acquired its image data or image charge, the image data is readout by readout circuitry 1211 and then transferred to functional logic 1215. In various examples, readout circuitry 1211 may include amplification circuitry, analog-to-digital (ADC) conversion circuitry, or otherwise. Function logic 1215 may simply store the image data or even manipulate the image data by applying post image effects (e.g., crop, rotate, remove red eye, adjust brightness, adjust contrast, or otherwise). In one example, readout circuitry 1211 may read out a row of image data at a time along readout column lines (illustrated) or may readout the image data using a variety of other techniques (not illustrated), such as a serial readout or a full parallel readout of all pixels simultaneously.

In one example, control circuitry 1221 is coupled to pixel array 1205 to control operation of the plurality of photodiodes in pixel array 1205. For example, control circuitry 1221 may generate a shutter signal for controlling image acquisition. In one example, the shutter signal is a global shutter signal for simultaneously enabling all pixels within pixel array 1205 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 1200 may be included in a digital camera, cell phone, laptop computer, automobile or the like. Additionally, imaging system 1200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 1200, extract image data from imaging system 1200, or manipulate image data supplied by imaging system 1200.

Figure 7B:
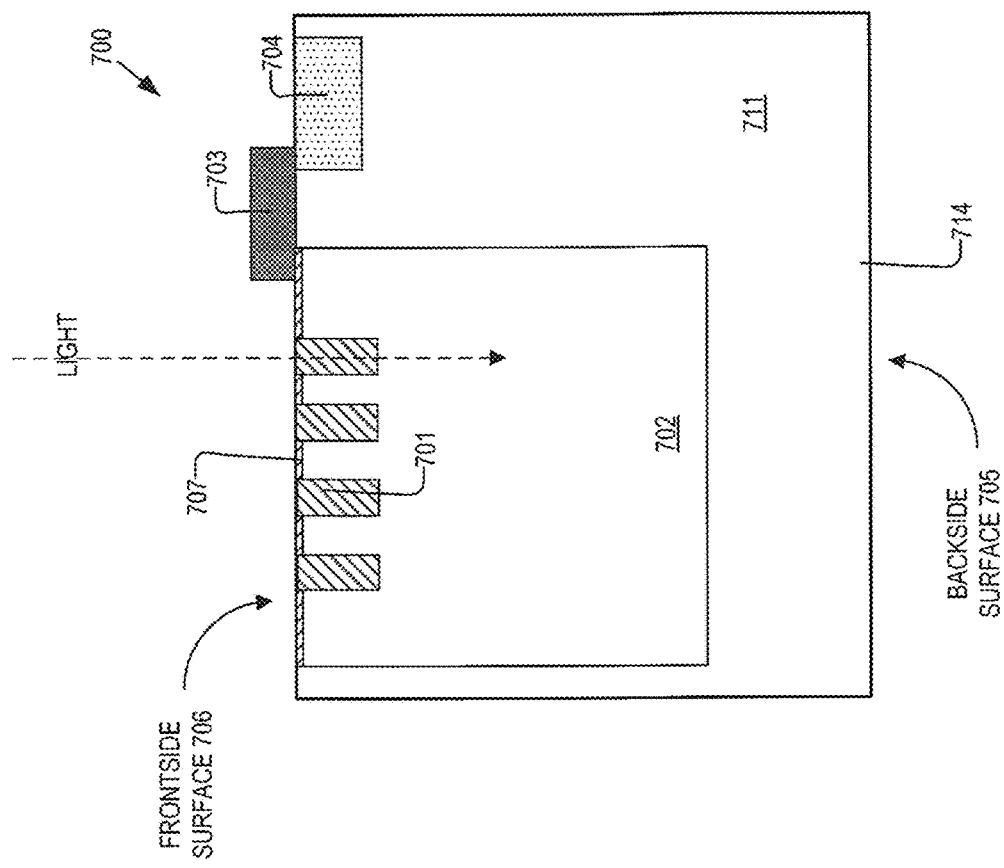
FIG. 7A is a top-down view and FIG. 7B is a cross-sectional view of FIG. 7A as cut along line G-G' for an example front side illuminated imaging sensor, in accordance with an embodiment of the invention.
Figure 7A:
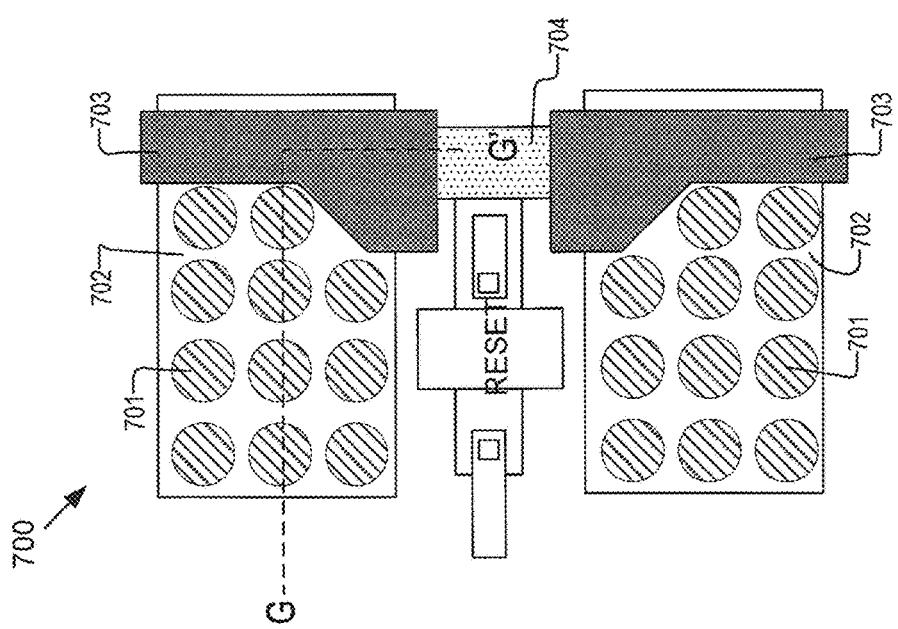

In one example, FIG. 7A is a top-down illustration of an example front side illuminated image sensor 700 in the array pixel 1205 of FIG. 12, in accordance with an embodiment of the invention. FIG. 7B is a cross-sectional illustration of FIG. 7A as cut along line G-G'. The front side illuminated image sensor 700 comprises a semiconductor material 711 as a substrate. In one example, the semiconductor material 711 is P type doped Si substrate. Photodiode 702 is disposed in the semiconductor material 711 to receive image light through front side surface 706 as an illuminated surface of the semiconductor material 711. In one example, dopants are implanted into the semiconductor material 711 to form the photodiode 702. A transfer gate 703 is electrically coupled to the photodiode 702 to transfer image charge from the photodiode 702 in response to a transfer signal. In one example, the transfer gate 703 includes a poly gate and a dielectric thin film between the poly gate and the semiconductor material 711. A floating diffusion 704 is electrically coupled to the transfer gate 703 to receive the image charge from the photodiode 702. In one example, in order to reduce the dark current caused by the hot electrons, a front side P+ doped layer 707 is disposed on the front side surface 706. The front side P+ doped layer 707 may be formed with P type doping by ion implantation or plasma doping process. In the depicted example in FIG. 7A, a reset transistor RESET is coupled to the floating diffusion 704 to reset image charge in the floating diffusion 704. Although not depicted in FIG. 7A, an amplifier transistor may also be coupled to the floating diffusion 704 to amplify the image charge in the floating diffusion 704.

Figure 8B:
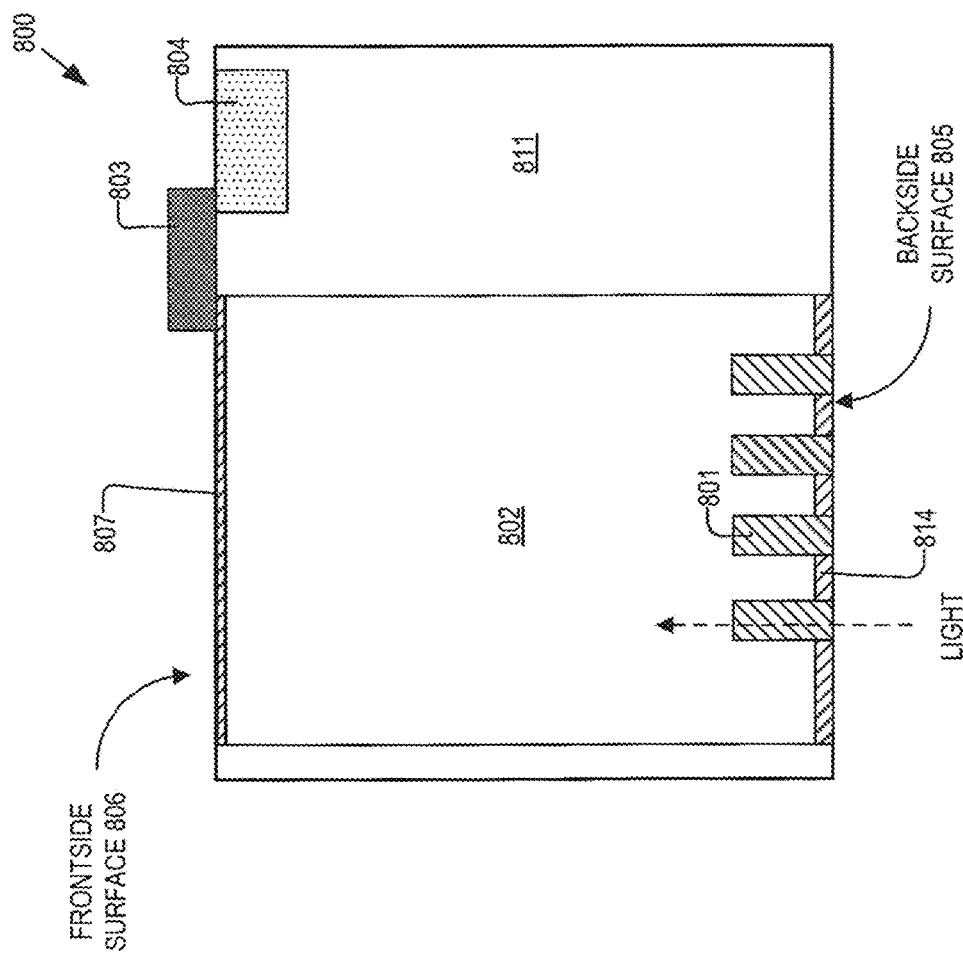
FIG. 8A is a top-down view and FIG. 8B is a cross-sectional view of FIG. 8A as cut along line H-H' for an example backside illuminated imaging sensor, in accordance with an embodiment of the invention.
Figure 8A:
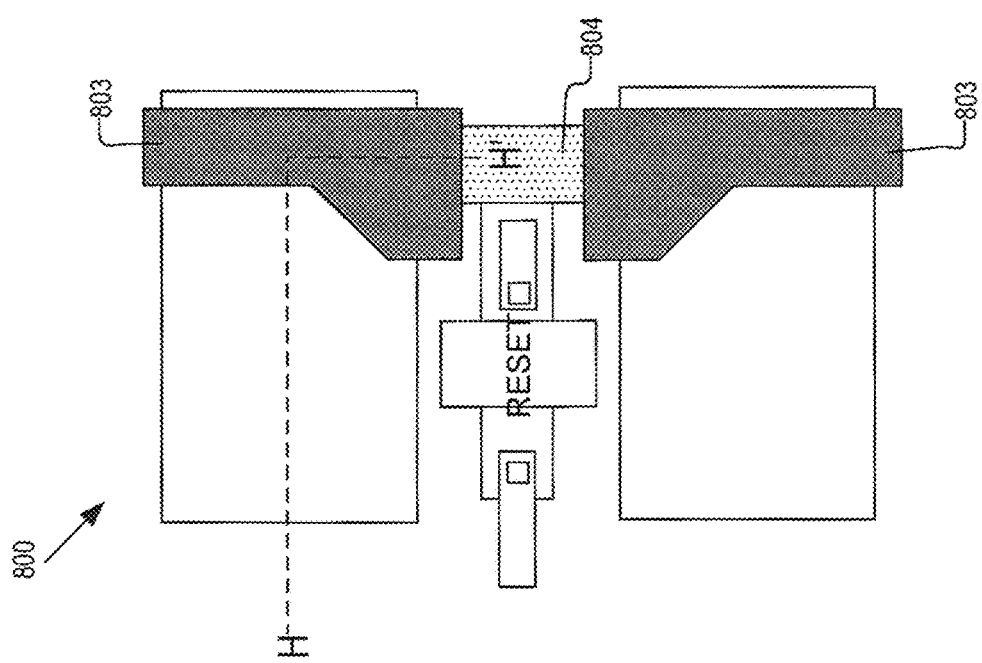

In one example, FIG. 8A is a top-down illustration of an example back side illuminated image sensor 800 in the array pixel 1205 of FIG. 12, in accordance with an embodiment of the invention. FIG. 8B is a cross-sectional illustration of FIG. 8A as cut along line H-H'. The back side illuminated image sensor 800 comprises a semiconductor material 811. In one example, the semiconductor material 811 is a P type doped Si layer. Photodiode 802 is disposed in the semiconductor material 811 to receive image light through back side surface 805 as an illuminated surface of the semiconductor material 811. In one example, dopants are implanted into the semiconductor material 811 to form the photodiode 802. A transfer gate 803 is electrically coupled to the photodiode 802 to extract image charge from the photodiode 802 in response to a transfer signal. In one example, the transfer gate 803 includes a poly gate and a dielectric thin film between the poly gate and the semiconductor material 811. A floating diffusion 804 is electrically coupled to the transfer gate 803 to receive the image charge from the photodiode 802. In one example, in order to reduce the dark current caused by the hot electrons from the front side surface 806, a front side P+ doped layer 807 is disposed on the front side surface 806. The front side P+ doped layer 807 may be formed with P type doping by ion implantation or plasma doping process. In order to reduce the dark current caused by the hot electrons from the back side surface 805, a back side P+ doped layer 814 is also disposed on the back side surface 805. The back side P+ doped layer 814 may be formed with P type doping by ion implantation or plasma doping process. The back side P+ doped layer 814 may also be formed by depositing a negative charged dielectric material on the backside surface 805. In the depicted example in FIG. 8A, a reset transistor RESET is coupled to the floating diffusion 804 to reset image charge in the floating diffusion 804. Although not depicted in FIG. 8A, an amplifier transistor may also be coupled to the floating diffusion to amplify the image charge in the floating diffusion 804.

As illustrated in both FIG. 7A-7B and FIG. 8A-8B, a plurality of near infrared (NIR) quantum efficiency (QE) enhancement structures are disposed at the illuminated surface in the photodiode and configured to modify the incident light at the illuminated surface of the semiconductor material by at least one of diffraction, deflection and reflection, to redistribute the incident light within the photodiode to improve an optical sensitivity, including near-infrared light sensitivity, of the image sensor. In one example, each of the NIR QE enhancement structures comprises at least two NIR QE enhancement elements within a region of the photodiode.

In the depicted examples in FIG. 7A-7B, the NIR QE enhancement elements 701 are disposed in the photodiode 702 at the front side surface 706 where the incident light is received through. In the depicted examples in FIG. 8A-8B, the NIR QE enhancement elements 801, which are the same as 701, are disposed in the photodiodes 802 at the backside surface 805 where the incident light is received through. Since 801 are at the backside surface 805, they are not visible in the top down illustration FIG. 8A.

As the examples illustrated in FIG. 7 and FIG. 8, the NIR QE enhancement elements 701 and 801 are arranged into rows and columns. Each of the NIR QE enhancement elements has a same shape as a trench structure (701 in FIGS. 7 and 801 in FIG. 8). In one example, the trench structure has 0.2 um critical dimension and 0.4 um depth. Each of the NIR QE enhancement elements extends from the illuminated surface, through the P+ doped layer, and into the photodiodes in the semiconductor material.

In one example, each of the NIR QE enhancement elements comprises a core dielectric material which has a refractive index smaller than the refractive index of the semiconductor material. As one example, the semiconductor material is silicon. However, one skilled in the art will appreciate that any group III elements (B, Al, Ga, In, Tl), group IV elements (C, Si, Ge, Sn, Pb), group V elements (N, P, As, Sb, Bi), and suitable combinations of these elements, may be used to form the semiconductor material, in accordance with the teachings of the present invention. In some examples, the core dielectric material may include oxides/nitrides such as silicon oxide ($SiO_2$), hafnium oxide ($HfO_2$), silicon nitride ($Si_3N_4$), silicon oxynitirde ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like. Additionally, one skilled in the relevant art will recognize that any stoichiometric combination of the above metals/semiconductors and their oxides/nitrides/oxynitrides may be used, as long as they have a refractive index smaller than the refractive index of the semiconductor material, in accordance with the teachings of the present invention.

Although not illustrated in FIG. 7 and FIG. 8, each of the NIR QE enhancement elements may also comprise a liner material disposed between the photodiode and the core dielectric material. In some examples, the liner material may include at least one of a negatively charged high k dielectric material, or a doped semiconductor material. For example, a trench could be etched and boron, nitrogen, or arsenic could be implanted into the sidewalls of the trench to form a doped semiconductor material as the liner material. Alternatively, a trench could be etched and hafnium oxide could be deposited in the trench to form a negatively charged high-k liner material before the core dielectric material is deposited into the trench.

In other examples, each of the NIR QE enhancement elements may also comprise one shape of a parallelepiped, a polygon, cylinder, an ellipsoid, a hemispheroid, and a hemisphere. They may also take other configurations as long as they have a uniform critical dimensions and shape, and are disposed in a periodic pattern with consistent distance between adjacent NIR QE elements. Some of examples are illustrated in FIG. 1 to FIG. 6.

FIG. 1A-6A are top-down views and FIG. 1B-6B are cross-sectional views of FIG. 1A-6A as cut along lines for an example photodiode 102 in an image sensor of pixel array 1205 in FIG. 12, in accordance with an embodiment of the invention. Also depicted are isolation regions 103. As one example, the isolation region 103 surrounds the photodiode 102 and extends through the semiconductor material from the illuminated surface so as to isolate the adjacent photodiodes 102 electrically and optically. In one example, the isolation regions 103 may include deep trench isolation structures. In order to keep the description consistent and simple, the isolation region is defined with the same number 103 and the photodiode is defined with the same number 102 in FIG. 1 to FIG. 6.

Figure 1A:
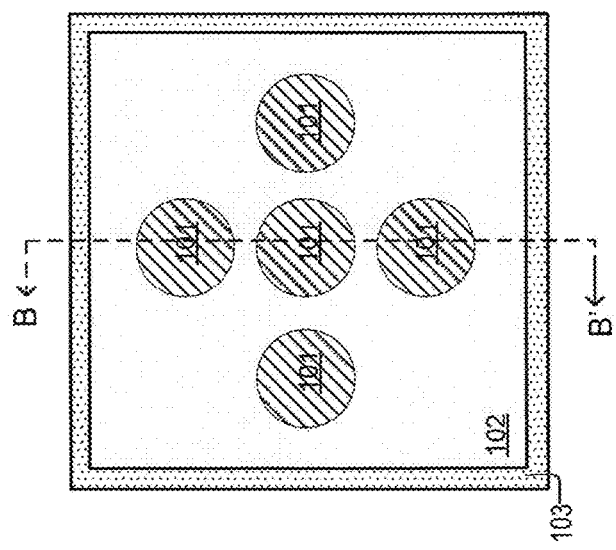
FIG. 1A is a top-down view and FIG. 1B is a cross-sectional view of FIG. 1A as cut along line A-A' for an example photodiode in an image sensor, in accordance with an embodiment of the invention.
Figure 1B:
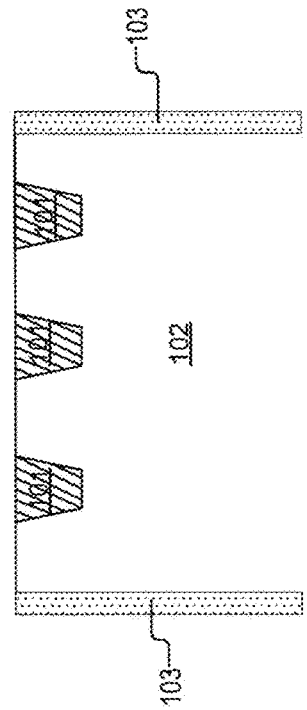
Figure 3A:
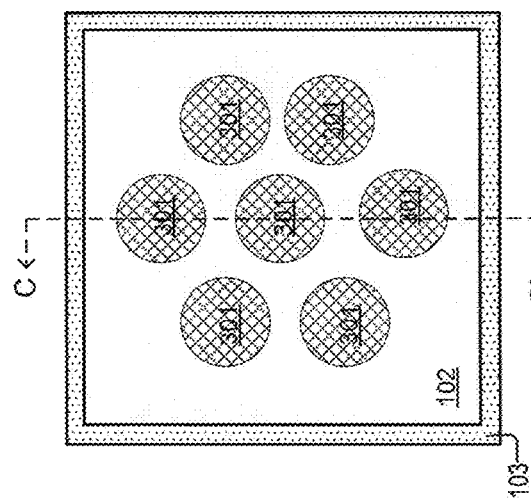
FIG. 3A is a top-down view and FIG. 3B is a cross-sectional view of FIG. 3A as cut along line C-C' for an example photodiode in an image sensor, in accordance with an embodiment of the invention.
Figure 3B:
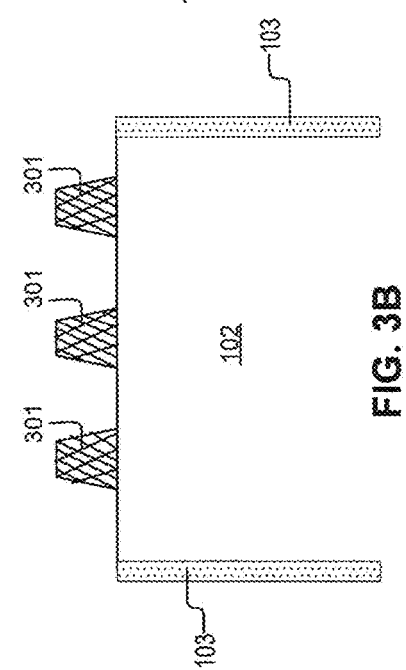
Figure 4A:
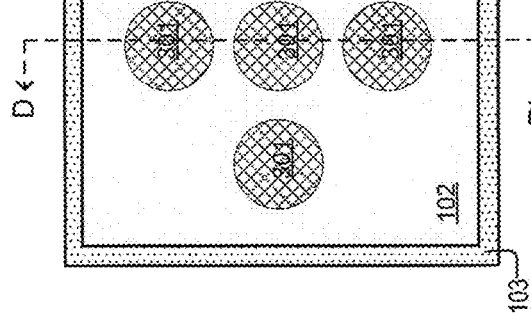
FIG. 4A is a top-down view and FIG. 4B is a cross-sectional view of FIG. 4A as cut along line D-D' for an example photodiode in an image sensor, in accordance with an embodiment of the invention.
Figure 4B:
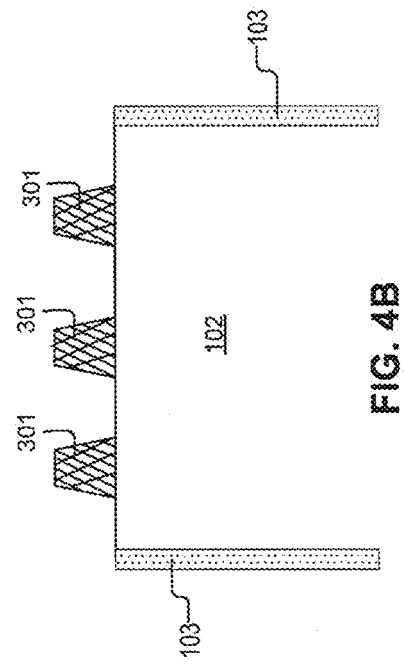
Figure 5A:
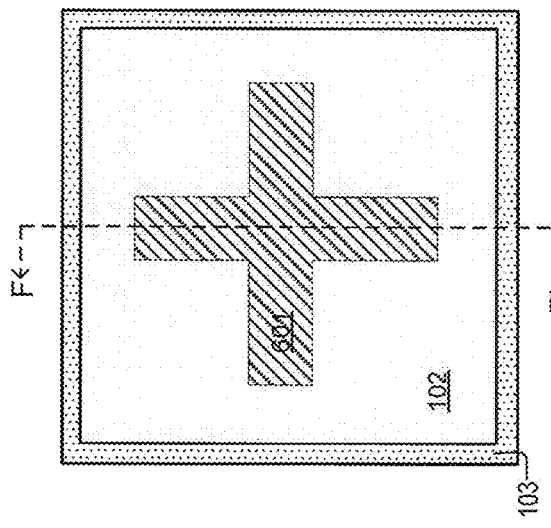
FIG. 5A is a top-down view and FIG. 5B is a cross-sectional view of FIG. 5A as cut along line E-E' for an example photodiode in an image sensor, in accordance with an embodiment of the invention.
Figure 6A:
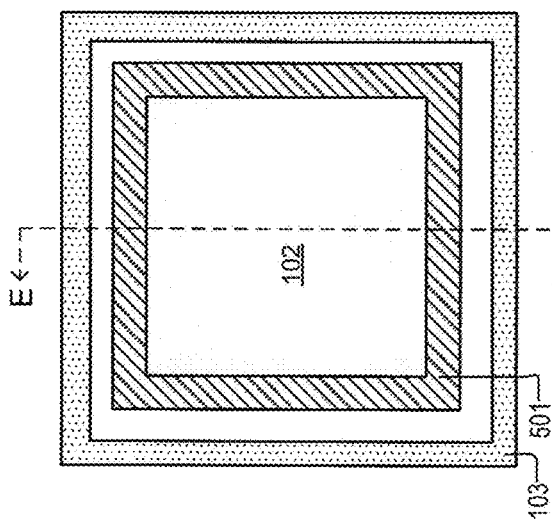
FIG. 6A is a top-down view and FIG. 6B is a cross-sectional view of FIG. 6A as cut along line F-F' for an example photodiode in an image sensor, in accordance with an embodiment of the invention.
Figure 5B:
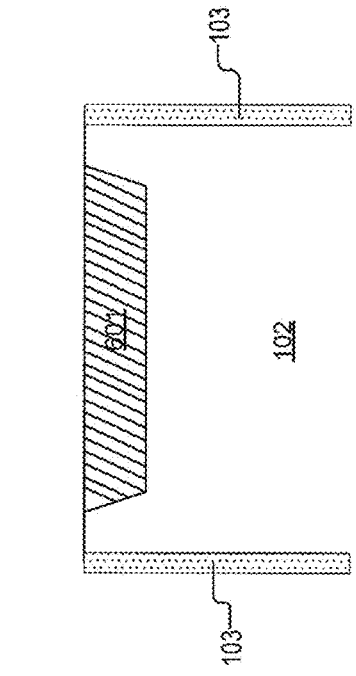
Figure 6B:
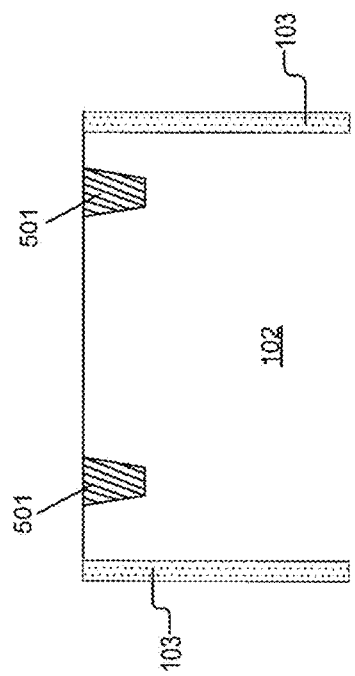

As an illustrated example in FIGS. 1A and 3A, the NIR QE enhancement elements 101 are arranged as a circle pattern with one NIR QE enhancement element at the center and the rest of NIR QE enhancement elements along the circle. Each two adjacent NIR QE enhancement elements along the circle are separated with the same distance. As an illustrated example in FIGS. 2A and 4A, the NIR QE enhancement elements 101 are arranged as a square pattern with one at the center and the rest at the four corners of the square. Each two adjacent NIR QE enhancement elements at the corners are separated with the same distance.

In one example, each of the NIR QE enhancement structures may also comprise only one NIR QE enhancement element within a region of the photodiode. As an illustrated example in FIG. 5A, the NIR QE enhancement element 501 is formed with a frame pattern which is adjacent to the isolation region 103. As an illustrated example in FIG. 6A, the NIR QE enhancement element 601 is formed with a cross pattern which is at the center of the photodiode 102.

As an illustrated example in FIGS. 1B-2B and 5B-6B, each of the NIR QE enhancement elements is formed as a trench structure which has a same critical dimension and a same depth. They extend from the illuminated surface into the photodiode and are filled with the core dielectric material. Although not illustrated, each of the NIR QE enhancement elements may also comprise the liner material disposed between the photodiode and the core dielectric material. Alternately, as an illustrated example in FIG. 3B-4B, each of the NIR QE enhancement elements may also be disposed at least partially on the top of the illuminated surface, and comprises the core dielectric material.

In an example, FIG. 9A demonstrates incident light path through two adjacent buried color filter array (BCFA) backside illuminated (BSI) image sensors without NIR QE enhancement structures. The pixel size of each photodiode is 2.0 μm. The image sensors are built in 3 μm thick Si layer. A deep trench isolation (DTI) structure is disposed between two adjacent photodiodes, a metal grid between two adjacent color filters, and two microlens on the top of respective color filters.

As illustrated in FIG. 9A, for the BCFA BSI image sensors without NIR QE enhancement structures, the incident light with different wavelength is transmitted into different depth in the Si layer. The incident light with longer wavelength may have deeper light path into the Si layer. If the thickness of the Si layer is shorter than the depth of the incident light path, which usually happens to NIR incident light with wavelength longer than 800 nm, part of incident light may be transmitted through the Si layer without being absorbed by Si completely. As a result, QE may be low accordingly. In one example, FIG. 9B is the simulated incident light density distribution in the BCFA BSI image sensors of FIG. 9A. The majority of NIR incident light is distributed along the light path and transmitted through the photodiode. FIG. 11 demonstrates the simulated QE of incident light with different wavelength based on the same BCFA BSI image sensors as FIG. 9A. QE of incident light with 850 nm wavelength is ~15%, and QE with 940 nm wavelength is ~11%.

Figures 10A, 10B:
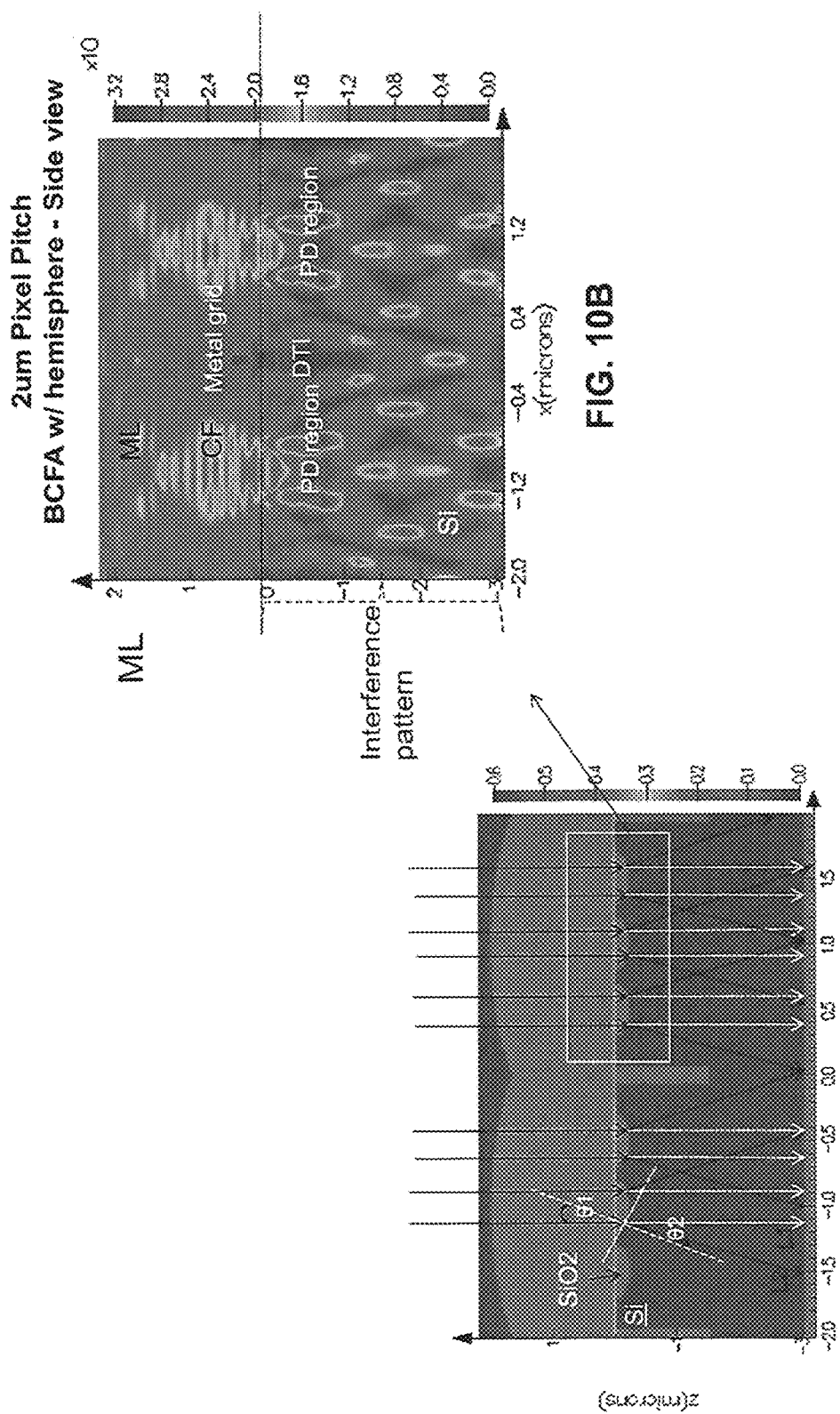
FIG. 10A demonstrates light path through an example backside illuminated image sensor with a plurality of NIR QE enhancement structures, FIG. 10B demonstrates the simulated light density distribution in the backside illuminated image sensor of FIG. 10A, in accordance with an embodiment of the invention.

As a comparison, FIG. 10A also demonstrates the incident light path through the same two adjacent BCFA BSI image sensors as FIG. 9A, but with a plurality of NIR QE enhancement structures disposed in the photodiodes at the backside surface. The NIR QE enhancement structures are configured to have the same square pattern as FIG. 2A. Each of the NIR QE enhancement elements has a hemisphere shape with 0.2 μm radius, which is extended from the backside surface into the Si layer and filled with SiO2. SiO2 has a refractive index about 1.45 while Si has a refractive index about 3.673. When the incident light is transmitted from SiO2 into the photodiode in the Si layer, the light path gets modified at the backside surface by at least one of diffraction, deflection and reflection. Accordingly, the incident light gets redistributed within the photodiode as illustrated in FIG. 10B, which causes more incident light staying in the Si layer and being absorbed by Si. As a result, NIR light sensitivity of the image sensor is improved. FIG. 11 demonstrates the simulated QE of incident light with different wavelength based on the same BCFA BSI image sensors as FIG. 10A. QE of incident light with 850 nm wavelength is increased from ~15% to ~40%, and QE with 940 nm wavelength is increased from ~11% to ~34%. On the other hand, QE of red, blue and green light is not impacted significantly by NIR QE enhancement structures, because their light path has a depth shorter than the Si layer. Moreover, one skilled in the art will also appreciate that DTI needs to be deep enough in order to prevent the optical and electrical cross talk between the two adjacent photodiodes in FIG. 10A and FIG. 10B.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a semiconductor material having an illuminated surface and a non-illuminated surface;
   a photodiode formed in the semiconductor material extending from the illuminated surface to receive an incident light through the illuminated surface, wherein the received incident light generates charges in the photodiode;
   a transfer gate electrically coupled to the photodiode to transfer the generated charges from the photodiode in response to a transfer signal;
   a floating diffusion electrically coupled to the transfer gate to receive the transferred charges from the photodiode;
   a near infrared (NIR) quantum efficiency (QE) enhancement structure comprising at least two NIR QE enhancement elements within a photosensitive region of the photodiode, wherein the NIR QE enhancement structure is configured to modify the incident light at the illuminated surface of the semiconductor material by at least one of diffraction, deflection and reflection, to redistribute the incident light within the photodiode to improve an optical sensitivity, including near-infrared light sensitivity, of the image sensor.

2. The image sensor of claim 1, wherein each NIR QE enhancement element of the NIR QE enhancement structure comprises a dielectric material having a refractive index smaller than a refractive index of the semiconductor material.

3. The image sensor of claim 1, wherein the at least two NIR QE enhancement elements have a uniform size and shape, and are disposed in a periodic pattern.

4. The image sensor of claim 1, wherein each NIR QE enhancement element of the NIR QE enhancement structure comprises a shape of one of a parallelepiped, a polygon, a cylinder, an ellipsoids, a hemispheroid, and a hemisphere.

5. The image sensor of claim 1, wherein the illuminated surface of the semiconductor material is one of a front side surface and a back side surface of the semiconductor material.

6. The image sensor of claim 1, wherein each NIR QE enhancement element of the NIR QE enhancement structure extends from the illuminated surface of the semiconductor material in the photodiode.

7. The image sensor of claim 1, wherein each NIR QE enhancement element of the NIR QE enhancement structure is disposed at least partially on the illuminated surface of the semiconductor material.

8. The image sensor of claim 1, wherein an isolation region surrounds, at least partially, the photodiode, and isolates the photodiode electrically and optically.

9. The image sensor of claim 1, further comprising a reset transistor electrically coupled to the floating diffusion to reset the charges received in the floating diffusion.

10. The image sensor of claim 1, further comprising an amplifier transistor electrically coupled to the floating diffusion to amplify the charges received in the floating diffusion.

11. An imaging system, comprising:
    a semiconductor material having an illuminated surface and a non-illuminated surface;
    a plurality of photodiodes formed in the semiconductor material extending from the illuminated surface to receive an incident light through the illuminated surface, wherein the received incident light generates charges in the photodiodes;
    a plurality of isolation structures, wherein each of the plurality of isolation structures is disposed between two adjacent photodiodes of the plurality of photodiodes;
    a plurality of transfer gates electrically coupled to the plurality of photodiodes to transfer the generated charges from the plurality of photodiodes to one or more floating diffusions;
    A plurality of near infrared (NIR) quantum efficiency (QE) enhancement structures, wherein each of NIR QE enhancement structures comprises at least two NIR QE enhancement elements within the a photosensitive region of individual photodiode of the plurality of photodiodes, wherein the NIR QE enhancement structures are configured to modify incident light at the illuminated surface of the semiconductor material by at least one of diffraction, deflection and reflection, to redistribute the incident light within the photodiode to improve an optical sensitivity, including near infrared light sensitivity, of the image system.

12. The imaging system of claim 11, further comprising a plurality of reset transistors, wherein each of the plurality of reset transistors electrically coupled to the one or more floating diffusions to reset the charges received in the one or more floating diffusions.

13. The imaging system of claim 11, further comprising a plurality of amplifier transistors, wherein each of the plurality of amplifier transistors electrically coupled to the one or more floating diffusions to amplify the charges received in the one or more floating diffusions.

14. The imaging system of claim 11, further comprising a control circuitry and a readout circuitry, wherein the control circuitry controls operation of the plurality of photodiodes, and the readout circuitry reads out image data from the plurality of photodiodes.

15. The imaging system of claim 11, wherein each NIR QE enhancement element of the NIR QE enhancement structures comprises a dielectric material having a refractive index smaller than a refractive index of the semiconductor material.

16. The imaging system of claim 11, wherein at least two NIR QE enhancement elements of the NIR QE enhancement structures have a uniform size and shape, and are disposed in a periodic pattern.

17. The imaging system of claim 11, wherein each NIR QE enhancement element of the NIR QE enhancement structures comprises a shape of one of a parallelepiped, a polygon, a cylinder, an ellipsoids, a hemispheroid, and a hemisphere.

18. The imaging system of claim 11, wherein each NIR QE enhancement element of the NIR QE enhancement structures extends from the illuminated surface of the semiconductor material in the photodiode.

19. The imaging system of claim 11, wherein each NIR QE enhancement element of the NIR QE enhancement structures is disposed at least partially on the illuminated surface of the semiconductor material.

20. The imaging system of claim 11, wherein the illuminated surface of the semiconductor material is one of a front side surface and a back side surface of the semiconductor material.

* * * * *